(12) United States Patent
Byun et al.

(10) Patent No.: US 7,033,738 B2
(45) Date of Patent: *Apr. 25, 2006

(54) PROCESS OF FORMING A MICRO-PATTERN OF A METAL OR A METAL OXIDE

(75) Inventors: Young Hun Byun, Daejun-Shi (KR); Soon Taik Hwang, Daejun-Shi (KR); Euk Che Hwang, Daejun-Shi (KR); Seok Chang, Daejun-Shi (KR)

(73) Assignee: Samsung Electronics Co., Ltd., Kyungki Do (KR)

( * ) Notice: Subject to any disclaimer, the term of this patent is extended or adjusted under 35 U.S.C. 154(b) by 174 days.

This patent is subject to a terminal disclaimer.

(21) Appl. No.: 10/335,851

(22) Filed: Jan. 3, 2003

(65) Prior Publication Data

US 2003/0157440 A1    Aug. 21, 2003

(30) Foreign Application Priority Data

Jan. 3, 2002  (KR) .................................. 2002-276

(51) Int. Cl.
*G03C 5/00*  (2006.01)

(52) U.S. Cl. .................... 430/322; 430/270.1; 430/330

(58) Field of Classification Search ................ 430/322, 430/270.1, 330
See application file for complete search history.

(56) References Cited

U.S. PATENT DOCUMENTS

| 5,064,685 | A |   | 11/1991 | Kestenbaum et al. |
| 5,534,312 | A |   | 7/1996 | Hill et al. |
| 2003/0124457 | A1 | * | 7/2003 | Jung et al. ................ 430/270.1 |
| 2003/0207568 | A1 | * | 11/2003 | Byun et al. ................ 438/681 |

FOREIGN PATENT DOCUMENTS

JP    62-263973 A1    11/1987

* cited by examiner

*Primary Examiner*—John A. McPherson
*Assistant Examiner*—Daborah Chacko-Davis
(74) *Attorney, Agent, or Firm*—Harness, Dickey & Pierce PLC

(57) ABSTRACT

A rapid and efficient process of forming a metal-containing pattern by producing, through photoreaction, a difference in solubility between exposed and unexposed areas of a thing film, and developing the film to produce a patterned film, followed by oxidation or reduction to provide a pure metal or metal oxide pattern.

18 Claims, No Drawings

PROCESS OF FORMING A MICRO-PATTERN OF A METAL OR A METAL OXIDE

BACKGROUND OF THE INVENTION

This application claims the benefit of the Korean Application No. 2002-0000276 filed on Jan. 3, 2002, which is hereby incorporated by reference.

1. Field of the Invention

The present invention relates, in general, to a process of forming a micro-pattern of a metal or a metal oxide, and more particularly, to a process of forming a micro-pattern of a metal or a metal oxide, wherein a metal complex is used which exhibits a difference of solubility depending on the degree of exposure to light having a particular wavelength.

2. Description of the Prior Art

As is well known to those skilled in the art, a patterned thin film formed on a substrate using materials having different electrical properties has been applied to various electronic devices. In an electronic device production process, a metal thin film is generally coated on a substrate such as a crystallized silicone wafer and then patterned.

A conventional method of forming a metal pattern comprises the steps of applying an organometallic compound on a surface of a silicone or glass substrate using a chemical vapor deposition process or an atomic layer deposition process to form a thin film on the substrate; coating a photoresist on the resulting organometallic film according to a spin coating process; patterning the resulting photoresist film according to a photolithography process; and etching the patterned photoresist film.

Another conventional method of forming a metal pattern comprises the steps of depositing a metal film on a substrate according to a plasma deposition process, a sputtering process, or an electric plating process; coating a photoresist on the resulting metal film; patterning the photoresist film using light; and etching the patterned photoresist film to reveal a desired metal pattern. Unfortunately, these conventional methods require conditions of high temperature and a vacuum, and essentially involve a patterning step using a photoresist and an etching step for removing the photoresist, thus having the disadvantage of a high production cost due to such a complicated process. Other disadvantages of these conventional methods are that the resolution of the resulting pattern is inevitably reduced because the patterning and etching steps are typically repeated several times, and that the surface of a deposited metal film is not smooth, causing these conventional methods to additionally require a flatting step.

Meanwhile, various methods of forming a metal pattern without using a photoreaction have been suggested. For example, Japanese Patent Publication No. 62-263973 discloses a method of forming a metal pattern, in which an electronic beam is irradiated on a thin film of a metal complex without inducing any photoreaction. In addition, U.S. Pat. No. 5,064,685 discloses a method of forming a metal thin film using a thermal decomposition reaction, comprising the steps of applying a metal complex-containing ink on a substrate; and heating the resulting substrate with the use of a laser beam. According to this patent, the substrate is exposed to a high temperature, and materials other than metals are prevented from being deposited on the substrate.

On the other hand, U.S. Pat. No. 5,534,312 describes that a metal pattern can be made through coating a substrate with a metal complex, prepared by bonding one or more photosensitive organic ligands to one or more metal atoms, and exposing the coated substrate directly to electromagnetic radiation without applying a photosensitive resin on the coating film of the metal complex. The metal complex essentially consists of at least one ligand selected from the group consisting of: acetylacetonates (both substituted and unsubstituted); dialkyldithiocarbamates; carboxylate; pyridines; amines; diamines; arsines; diarsenes; phosphines; diphosphenes; arenes; alkoxy ligands; alkyl ligands; and aryl ligands. Particularly, in the case that the complex comprises more than one ligand, at least one of the ligand is selected from the group consisting of: oxalato; halogens; hydrogen; hydroxy; cyano; carbonyl; nitro; nitrito; nitrate; nitrosyl; ethylenes; acetylenes; thiocyanato; isothyocyanato; aquo; azides; carbonato; amines; and, thiocarbonyl. When exposed to electromagnetic radiation, the metal complex goes through a photochemical reaction resulting in the dissociation of the organic ligands from the central metal atoms, to produce a new metal-containing material adherent to the substrate. However, this patent is disadvantageous in that the rate of such transformation is relatively low, and consequently many hours are required to complete the patterning process. Other disadvantages are that ligand contamination is likely to occur because the separation of the ligands from the metal completely depends on photoreaction, and that, if the final film consists of a metal oxide, the oxide film should be reduced and annealed under a mixed gas of hydrogen with nitrogen at 200° C. or higher for 30 minutes to several hours so as to improve the conductivity of the film. Additionally, the organic ligands constituting the metal complex have so large a steric hindrance, and consequently occupy so large a space as to result in a large percentage of contraction in the thickness of the resulting metal film upon their decomposition by exposure to light.

SUMMARY OF THE INVENTION

The present invention relates to a rapid and efficient process of forming a metal-containing pattern by causing a difference in solubility between exposed and unexposed areas of a thin film consisting of a metal complex, through a photoreaction, and developing the film to produce a patterned film, followed by oxidation or reduction so as to provide a pure metal or metal oxide pattern.

The present invention provides a method of forming a metal or metal oxide pattern on a substrate comprising the steps of:

(a) depositing a thin film of a metal complex on a surface of the substrate;

(b) providing a photomask having a desired pattern on the thin film;

(c) exposing the film to a light source using a photomask having a desired pattern, causing the metal complex in the exposed areas of the film to be decomposed resulting in a difference of solubility between the exposed areas and the unexposed areas;

(d) developing the film with an organic solvent capable of dissolving the metal complex to remove the metal complex in unexposed areas leaving only a metal-containing patterned film; and (e) reducing or oxidizing the metal-containing patterned film to provide a pure metal or metal oxide pattern on the substrate.

All of the above features and other features of the present invention will be successfully achieved from the present invention described in the following.

DETAILED DESCRIPTION OF THE INVENTION

The metal complexes used in the present invention are represented by the formula (I):

$$M_mL_nX_p \qquad (I)$$

wherein,

M is a metal atom selected from transition elements, lanthanoids, and main group elements;

L is an organic ligand comprising at least one donor atom and 20 or less carbon atoms;

X is a mono-, di-or tri-valent anion;

m is an integer ranging from 1 to 10, provided that M's may be different from each other when m is 2 or more;

n is an integer ranging from 0 to 60, provided that L's may be different from each other when n is 2 or more;

p is an integer ranging from 0 to 60, provided that X's may be different from each other when p is 2 or more;

n plus p is not equal to 0; and

M may be connected with another M by L when m is 2 or more.

In the metal complex of the formula (I), the number of ligands L to be coordinated to one metal atom depends on the kind and oxidation number of the metal, and up to 6 ligands can be bonded to one metal atom. Similarly, up to 6 anions can be bonded to one metal atom.

The metal M is preferably a post-transition element of IX–XII family including Co, Ag, Au, Cu, Pd, Ni, Pt, Zn, and Cd, or a main group element including Al.

The ligand L is an organic compound which consists essentially of both at least one donor atom such as N, P, As, O, S, Se, and Te and 20 or less carbon atoms. Non-limiting examples of such ligands include anionic ligands such as acetylacetonates, acetate, β-ketoiminates, β-diiminates, β-ketoesters, dialkyldithiocarbamates, carboxylate, oxalato, halogens, hydrogen, hydroxy, cyno, nitro, nitrate, nitroxyl, azides, carbonato, thiocyanato, isothiocyanato, alkoxy ligands, and derivatives thereof; and neutral ligands such as pyridines, amines, diamines, arsines, diarsines, phosphines, diphosphines, arenes, carbonyl, imidazolylidene, ethylene, acetylene, $H_2O$, thiocarbonyl, thioether, and derivatives thereof.

The anion X functions to adjust the net charge of the metal complex to zero, and may or may not make a coordinate bond with the metal atom. Preferable anions can be exemplified by halogeno, hydroxide, cyanide (CN—), nitrite ($NO_2$—), nitrate ($NO_3$—), nitroxyl (NO—), azide ($N_3$—), thiocyanato, isothiocyanato, tetraalkylborate ($BR_4$—, wherein R=Me, Et, or Ph), tetrahaloborate ($BX_4$—, wherein X=F, or Br), hexafluorophosphate ($PF_6$—), triflate ($CF_3SO_3$—), tosylate (Ts—), sulfate ($SO_{42}$—), and carbonate ($CO_{32}$—).

According to the present invention, the metal complex is first dissolved in an organic solvent to provide a coating solution that is suitable for application to a surface of a substrate. Then, the application of the coating solution can be accomplished by, for example, spin coating, roll coating, dip coating, spray coating, flow coating, or screen printing, with spin coating being most preferred. Preferable examples of the organic solvents used in the preparation of the coating solution include, but are not limited to, nitriles such as acetonitrile, propionitrile, pentanenitrile, hexanenitrile, heptanenitrile, and isobutylnitrile; aliphatic hydrocarbons such as hexane, heptane, octane, and dodecane; aromatic hydrocarbons such as anisole, mesitylene, and xylene; ketones such as methyl isobutyl ketone, 1-methyl-2-pyrrolidinone, cyclohexanone, and acetone; ethers such as tetrahydrofuran, diisobutyl ether, and isopropyl ether; acetates such as ethyl acetate, butyl acetate, and propylene glycol methyl ether acetate; alcohols such as isopropyl alcohol, butyl alcohol, hexyl alcohol, and octyl alcohol; and silicon-based solvents. More than two of these organic solvents can be also used in combination.

Meanwhile, the substrate used in the present invention includes, without limitation, substrates made of inorganic materials such as silicon and glass, as well as substrates made of organic materials such as plastics. Substrates made of a composite of organic materials with inorganic materials can be also used.

A coating film formed on the substrate as described above is exposed to electromagnetic radiation with a photomask placed thereon. During the exposure, the subject metal complex in exposed areas undergoes a photochemical reaction and is converted into a new metal-containing compound, which has a sufficiently low solubility in any of the developers described below when compared with the original metal complex. Thus, the electromagnetic radiation causes the coordinate bonds between the organic ligands and the metal atoms to be destabilized and broken, resulting in partial dissociation of the ligands from the metal atoms. Once such dissociation is triggered, decomposition of the remaining part of the metal complex progresses rapidly, leaving a metal or a metal oxide on the substrate depending on the atmosphere where the exposure was performed. While the mechanism by which such photochemical reaction occurs will vary in accordance with the metal and the ligand involved in the reaction, the following four mechanisms seem to primarily contribute to the unstabilization and break-down of the coordinate bonds between the organic ligands and the metal atoms: i) metal-to-ligand charge transfer; ii) ligand-to-metal charge transfer; iii) d-d excitation; and iv) intra-molecular charge transfer. As a light source for the electromagnetic radiation, UV light is preferred.

An important advantage of the present invention is that the coating film containing the subject metal complex is exposed to electromagnetic radiation only for a relatively short period of time, i.e., the time required for making the metal complex in the exposed areas insoluble in an organic solvent to be used in the subsequent developing step. Thus, the coating film of the metal complex need not be exposed for such a long time whereby the metal complex is entirely converted to a metal or a metal oxide. Thus the exposure time can be decreased to a minimum. Considering that a decrease in exposure time results in an increase in productivity, a shorter exposure time is generally favored.

While the optimal exposure time will vary depending on the ligands constituting the subject metal complex, it usually requires about 30 minutes or more for most ligands to be dissociated from the metal atom. However, only about 10 minutes is sufficient to make the complex in the exposed areas of the coating film much less soluble in the same solution than the complex in the unexposed areas. The exposed areas remain adherent on the substrate after the subsequent developing step, thereby providing a metal-containing patterned film.

Following the exposure, the unexposed areas of the coating film are washed off with a suitable developer. Then, only the exposed areas of the coating film remain on the substrate to provide the desired pattern. The developer may be the same as or different from the solvent used in the preparation of the coating solution, and may be also an inorganic solvent (e.g., tetramethylamoniumhydroxide, "TMAH") used in conventional semiconductor processes.

In the present invention, the steps of exposing and developing may be conducted under vacuum conditions or in an atmosphere of air, $O_2$, $H_2$, $N_2$, Ar or a mixture of such gas. During these steps, the temperature should be adjusted to room temperature or to a temperature range where the subject metal complex is safe from thermal decomposition.

After developing, the patterned film is subjected to reduction or oxidation. If a patterned film of a metal is desired, reduction is conducted in an atmosphere of a vacuum, $H_2$, $N_2$, Ar or a mixture of such gases, and if necessary, by using a suitable reductant. The reductants used in the present invention can be exemplified by organic reductants including hydrazines, silanes, amines, and derivatives thereof, as well as by inorganic reductants including metal hydrides such as $NaBH_4$ and $LiAlH_4$. These reductants can be used as a solution in a suitable solvent or by itself, depending on whether the reduction is performed in a gas-phase or a liquid-phase.

On the other hand, if the patterned film is desired to be composed of a metal oxide, oxidation is conducted in an atmosphere of air, or $O_2$ optionally by using a suitable oxidant. Useful oxidants can be exemplified by organic oxidants including N-oxides such as trimethylamine N-oxide and pyridine N-oxide, peroxides such as bis (trimethylsilyl) peroxide, perbenzoic acid, $O_3$ and $O_2$, as well as by inorganic oxidants including $H_2O_2$, $H_2SO_4$, and $HNO_3$.

For the purpose of enhancing the adhesive strength of the patterned film to the substrate, the patterned film can be optionally subjected to an additional annealing step at a temperature of 30–1,000° C. following the reduction or oxidation step. In the prior techniques, where the annealing step is essentially required for conversion of a metal precursor to a metal, a plastic substrate should not be used due to its poor thermal-resistance. On the other hand, the annealing step involved in the present invention does not aim to accomplish such thermal decomposition of a metal complex, and therefore the annealing temperature can be adequately controlled to prevent deformation of even a plastic substrate.

The present invention can be more clearly understood by referring to the following examples. It should be understood that the following examples are not intended to restrict the scope of the present invention in any manner. All procedures in the following examples are conducted in an $N_2$ atmosphere deprived of $O_2$ and moisture according to the Schlenk technique or the Glove box technique well known to one skilled in the art.

PREPARATION EXAMPLE 1

Synthesis of $Ag(NH_2Pr)_n(NO_3)$ Compound (n=1, 2, 3 and 4)

To a 50 ml round-bottom Schlenk flask is added 3.4 g (20.0 mmol) of silver nitrate ($AgNO_3$) together with 15 ml of acetonitrile ($CH_3CN$) and stirred to dissolve completely. To the flask is added, dropwise, 3.6 g (60.9 mmol) of propylamine by means of a syringe and allowed to react for 1 hour with stirring at room temperature. The reaction mixture is filtered through a 0.2 um membrane filter, and excess propylamine and acetonitrile are completely evaporated from the filtrate under reduced pressure, to produce colorless oil.

Mass spectrometry verified that different metal complexes, each comprising 1 propylamine ligands are present in the oil, and the molar ratio of the silver atom:propylamine ligand is proven by atomic analysis to be 1:1.2. These results indicate that the major product of this example is a compound where the molar ratio of the silver atom:propylamine ligand is 1:1. However, this complex is unstable. Expectedly, change of the molar ratio between the two starting materials (i.e., silver nitrate and propylamine) did not alter the $^1$H-NMR spectrum for the final product, where all protons resonated upfield compared to those of pure propylamine as follows:

$^1$H-NMR($CD_3CN$, ppm): 2.68 [t, 2H, N—$CH_2$], 1.49 [m, 2H, $CH_2CH_3$], 0.90 [t, 3H, $CH_2CH_3$]

EXAMPLES 1–3

Effect of Coating Solvent

Dependence of photosensitivity and reducibility of the metal complexes of Preparation Example 1 the on coating solvent is determined. The $Ag(NH_2Pr)_n(NO_3)$ compound (n=1, 2, 3 and 4) of Preparation Example 1 is dissolved in a nitrile solvent including acetonitrile ($CH_3CN$) and propionitrile ($CH_3CH_2CN$) and an alcohol solvent including isopropylalcohol (IPA), respectively, and then applied to a surface of a glass substrate by spin coating. The resulting coating film with a photomask positioned thereon is exposed to broadband UV light by means of Oriel 60200 (Oriel, USA), followed by developing with the same solvent as used in the coating step. Photosensitivity of the metal complex is measured by exposure time required for making exposed areas of the coating film insoluble in the developer (defined as "photoreaction time" in Table 1). The higher is the photosensitivity, the shorter is the photoreaction time. As shown in Table 1, significant variance of photosensitivity according to the coating solvent is not observed, indicating that both a nitrile solvent and an alcohol solvent are suitable for stability and coating property of the metal complex of the present invention.

After the developing step, the exposed areas of the coating film are reduced with 0.1M hydrazine solution in acetonitrile at room temperature under atmospheric pressure for 30 seconds, to provide a patterned film of pure silver. Reducibility was also hardly affected by the particular solvent used in the coating step. Similar results are obtained from reduction in a gas phase (data not shown).

TABLE 1

| Exam. | Metal complex* | Solvent | Photoreaction time (min) | Reductant (M/sec) | Specific resistance** (μΩcm) |
|---|---|---|---|---|---|
| 1 | $Ag(NH_2Pr)_n(NO_3)$ | $CH_3CN$ | 5 | Hydrazine (0.1/30) | 15–20 |
| 2 | $Ag(NH_2Pr)_n(NO_3)$ | $CH_3CH_2CN$ | 5 | Hydrazine (0.1/30) | 20–30 |

TABLE 1-continued

| Exam. | Metal complex* | Solvent | Photoreaction time (min) | Reductant (M/sec) | Specific resistance** (μΩcm) |
|---|---|---|---|---|---|
| 3 | $Ag(NH_2Pr)_n(NO_3)$ | IPA | 5 | Hydrazine (0.1/30) | 15–20 |

*Pr = propyl
**Specific resistance was measured by four-point probe.

EXAMPLES 4–11

Effect of Ligand

Other metal complexes, which are prepared in a similar manner as in the Preparation Example 1 except that various ligands are substituted for propylamine, are examined for photosensitivity and reducibility. All metal complexes, except $Ag\{NH(C_2H_4OH)_2\}_2(NO_3)$, are dissolved in acetonitrile, respectively, and then applied to a glass substrate surface by spin coating. Photosensitivity and reducibility of the resulting coating film are then determined in a similar manner as in Example 1. The results are summarized in Table 2, which indicate that the photosensitivity and reducibility of a metal complex are deteriorated by a ligand that has many carbon atoms and is bulky. Similar results were obtained from reduction in a gas phase (data not shown).

transparent, yellowish oil. Similar $^1$H-NMR spectrum is obtained as in the Preparation Example 1.

$^1$H-NMR(CD$_3$CN, ppm): 2.68 [t, 2H, N—CH$_2$], 1.49 [m, 2H, CH$_2$CH$_3$], 0.90 [t, 3H, CH$_2$CH$_3$]

EXAMPLES 12–14

Effect of Coating Solvent

Dependence of photosensitivity and reducibility of the metal complexes of Preparation Example 2 on coating solvent is determined. The $Ag(NH_2Pr)_n(NO_2)$ compound (n=1, 2, 3 and 4) of Preparation Example 2 is dissolved in a nitrile solvent including acetonitrile ($CH_3CN$) and propionitrile ($CH_3CH_2CN$) and an alcohol solvent including

TABLE 2

| Exam. | Metal complex* | Solvent | Photoreaction time (min) | Reductant (M/sec) | Specific resistance (μΩcm) |
|---|---|---|---|---|---|
| 4 | $Ag(NH_2Bu)_n(NO_3)$ | $CH_3CN$ | 5 | Hydrazine (0.1/30) | 15–20 |
| 5 | $Ag\{C_2H_5CH(NH_2)CH_3\}_2(NO_3)$ | $CH_3CN$ | 10 | Hydrazine (0.1/30) | 40–200 |
| 6 | $Ag(aniline)_2(NO_3)$ | $CH_3CN$ | 10 | Hydrazine (0.1/30) | ~2000 |
| 7 | $Ag(TMEDA)_2(NO_3)$ | $CH_3CN$ | 1 | Hydrazine (0.1/30) | ~100 |
| 8 | $Ag(t-BuNH_2)_2(NO_3)$ | $CH_3CN$ | 5 | Hydrazine (0.1/30) | 20–30 |
| 9 | $Ag(Py_2)(NO_3)$ | $CH_3CN$ | 10 | Hydrazine (0.1/30) | ~300 |
| 10 | $Ag(NH_2C_3H_6OH)_2(NO_3)$ | $CH_3CN$ | 10 | Hydrazine (0.1/30) | ~100 |
| 11 | $Ag\{NH(C_2H_4OH)_2\}_2(NO_3)$ | $C_2H_5OH$ | 5 | Hydrazine (0.1/30) | 20–30 |

*Bu = Butyl; TMEDA = tetramethylethylenediamine; Py = pyridine

PREPARATION EXAMPLE 2

Synthesis of $Ag(NH_2Pr)_n(NO_2)$ Compound (n=1, 2, 3 and 4)

To a 50 ml round-bottom Schlenk flask is added 3.08 g (20.0 mmol) of silver nitrite ($AgNO_2$) together with 15 ml of acetonitrile ($CH_3CN$) and stirred to dissolve completely. To the flask is dropwise added 3.6 g(60.9 mmol) of propylamine by means of a syringe and allowed to react for 1 hour with stirring at room temperature. The reaction mixture is filtered through a 0.2 um membrane filter, and excess propylamine and acetonitrile are completely evaporated from the filtrate under a reduced pressure, to produce a isopropylalcohol (IPA), respectively, and then applied to a surface of a glass substrate by spin coating. The resulting coating film with a photomask positioned thereon is exposed to broadband UV light by means of Oriel 60200 (Oriel, USA), followed by developing with the same solvent as used in the coating step. Subsequently, the exposed areas of the coating film are reduced with 0.01M hydrazine solution in acetonitrile at room temperature under atmospheric pressure, to provide a patterned film of pure silver. As shown in Table 3, excellent photosensitivity is observed regardless of the kind of the coating solvent, and reducibility is so improved that the relatively low concentration of reductant (i.e., 0.01M) is sufficient to provide a pure silver pattern.

TABLE 3

| Exam. | Metal complex* | Solvent | Photoreaction time (min) | Reductant (M/sec) | Specific resistance (μΩcm) |
|---|---|---|---|---|---|
| 12 | $Ag(NH_2Pr)_n(NO_2)$ | $CH_3CN$ | 3 | Hydrazine (0.01/10) | 15–20 |
| 13 | $Ag(NH_2Pr)_n(NO_2)$ | $CH_3CH_2CN$ | 3 | Hydrazine (0.01/10) | 20–30 |
| 14 | $Ag(NH_2Pr)_n(NO_2)$ | IPA | 3 | Hydrazine (0.01/10) | 15–20 |

*Pr = propyl

Meanwhile, the metal complexes of the Preparation Example 2 are proven to be superior to those of the Preparation Example 1 in light of solubility in the developer as well as photosensitivity.

EXAMPLES 15–20

Effect of Ligand and Anion

Other metal complexes, which are prepared in a similar manner as in the Preparation Example 1 except that the ligand (i.e., propylamine) and/or the anion (i.e., nitrite) is varied, are examined for photosensitivity and reducibility. Each metal complex is dissolved in acetonitrile, and then applied to a surface of a glass substrate by spin coating. Photosensitivity and reducibility of the resulting coating film are then determined in a similar manner as in Example 1. The results are summarized in Table 4.

TABLE 4

| Examp. | Metal complex* | Solvent | Photoreaction time (min) | Reductant (M/sec) | Specific resistance** (μΩcm) |
|---|---|---|---|---|---|
| 15 | $Ag(NH_2Bu)_n(NO_2)$ | $CH_3CN$ | 3 | Hydrazine (0.01/30) | 15–20 |
| 16 | $Ag(NH_2Pr)_n(BF_4)$ | $CH_3CN$ | 10 | Hydrazine (0.01/30) | ~3000 |
| 17 | $Ag(NH_2Pr)(Acac)$ | $CH_3CN$ | 30 | Hydrazine (0.01/30) | N.D. |
| 18 | $Ag(NH_2Pr)(DBM)$ | $CH_3CN$ | 30 | Hydrazine (0.01/30) | N.D. |
| 19 | $Ag(NH_2Pr)(Ac)$ | $CH_3CN$ | 30 | Hydrazine (0.01/30) | N.D. |
| 20 | $Ag(NH_2Pr)(N_3)$ | $CH_3CN$ | 30 | Hydrazine (0.01/30) | N.D. |

*Bu = Butyl; Pr = Propyl; Acac = acetylacetonate; DBM = dibenzoylmethane; Ac = acetate
**N.D. = not determined As shown in the Table 4, photosensitivity and reducibility are significantly affected by the change of ligand or anion. The metal complex used in Example 16, where $BF^{4-}$ is substituted for nitrite, exhibited slightly decreased photosensitivity, while adhesiveness to a glass substrate is highly improved. The metal complexes used in Example 17–20 exhibited much photosensitivity than that of $Ag(NH_2Pr)_n(NO_2)$ and even $Ag(NH_2Pr)_n(NO_3)$. Further, though electroconductive metal pattern is obtained in Examples 16–20, specific resistance thereof is so elevated to reach a MΩ level.

EXAMPLES 21–23

Effect of Reductant

Reducibility of the $Ag(NH_2Pr)_n(NO_3)$ compound and the $Ag(NH_2Pr)_n(NO_2)$ compound is examined, respectively, by using $LiAlH_4$ or trimethoxy silane as a reductant. Deposition of a coating film on a surface of a glass substrate followed by patterning and reduction is conducted according to the same manner as in the above Example 1. As shown in Table 5, reduction is successfully accomplished though $LiAlH_4$ and trimethoxy silane are somewhat inferior to hydrazine in their reducing power.

TABLE 5

| Exam. | Metal complex* | Solvent | Photoreaction time (min) | Reductant (M/sec) | Specific resistance** (μΩcm) |
|---|---|---|---|---|---|
| 21 | $Ag(NH_2Pr)_n(NO_3)$ | $CH_3CN$ | 5 | $LiAlH_4$/THF (0.1/30) | 30–40 |
| 22 | $Ag(NH_2Pr)_n(NO_2)$ | $CH_3CN$ | 3 | $LiAlH_4$/THF (0.1/30) | 20–30 |

TABLE 5-continued

| Exam. | Metal complex* | Solvent | Photoreaction time (min) | Reductant (M/sec) | Specific resistance** (μΩcm) |
|---|---|---|---|---|---|
| 23 | Ag(NH$_2$Pr)$_n$(NO$_2$) | CH$_3$CN | 3 | (MeO)$_3$SiH (0.5/30) | 200–220 |

*Pr = Propyl
**N.D. = not determined

EXAMPLES 24–27

Effect of Metal

Metal complexes having a different metal component other than silver, which are prepared in a similar manner as in the Preparation Example 1, are examined for photosensitivity and reducibility, respectively. Deposition of a coating film on a surface of a glass substrate followed by patterning and reduction is conducted according to the same manner as in the above Example 1. As shown in Table 6, metal complexes containing copper or cobalt exhibited relatively low photosensitivity and fairly high specific resistance amounting to about 3–4 MΩcm, but they succeeded in providing an electroconductive patterned film. Particularly, Au(NH$_2$Pr)$_n$CN is readily reduced by hydrazine like the Ag complexes and exhibited very low specific resistance ranging from 20 to 30 μΩcm.

TABLE 6

| Exam. | Metal complex* | Solvent | Photoreaction time (min) | Reductant (M/sec) | Specific resistance** (μΩcm) |
|---|---|---|---|---|---|
| 24 | Cu(NH$_2$Pr)$_n$(NO$_3$)$_2$ | CH$_3$CN | 30 | Hydrazine (0.1/30) | N.D. |
| 25 | Au(NH$_2$Pr)$_n$(CN) | CH$_3$CN | 30 | Hydrazine (0.01/30) | 20–30 |
| 26 | Au(NH$_2$Pr)$_n$(Cl) | CH$_3$CN | 30 | Hydrazine (0.01/30) | N.D. |
| 27 | Co(Acac)$_2$ | CH$_3$CN | 30 | Hydrazine (0.01/30) | N.D. |

*Pr = Propyl; Acac = acetylacetonate
**N.D. = not determined

As stated above, by virtue of the present invention, it has been realized to form electroconductive patterned films of a metal through are easy coating process and simple chemical reactions, without using photosensitive resins.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming a metal or metal oxide pattern on a substrate comprising the steps of:
   (a) depositing a thin film of a metal complex on a surface of the substrate;
   (b) providing a photomask having a desired pattern on the thin film;
   (c) exposing the film to a light source to cause the metal complex in the exposed areas of the film to be decomposed resulting in a difference of solubility between the exposed areas and the unexposed areas;
   (d) developing the film with an organic solvent to remove the metal complex in the unexposed areas leaving only a metal-containing patterned film; and
   (e) reducing or oxidizing the metal-containing patterned film to provide a pure metal or metal oxide pattern on the substrate.

2. The method according to claim 1, wherein the metal complex is represented by the formula (I):

$$M_m L_n X_p \quad (1)$$

wherein,
   M is a metal atom selected from transition elements, lanthanoids, and main group elements;
   L is an organic ligand comprising at least one donor atom and 20 or less carbon atoms;
   X is a mono-, di- or tri-valent anion;
   m is an integer ranging from 1 to 10, provided that M's may be different from each other when m is 2 or more;
   n is an integer ranging from 0 to 60, provided that L's may be different from each other when n is 2 or more;
   p is an integer ranging from 0 to 60, provided that X's may be different from each other when p is 2 of more;
   n plus p is not equal to 0; and
   M may be connected with another M by L when m is 2 or more.

3. The method according to claim 1, wherein the metal complex is dissolved in a nitrile-based solvent, an aliphatic hydrocarbon-based solvent, an aromatic hydrocarbon-based solvent, a ketone-based solvent, an ether-based solvent, an Acetate-based solvent, an alcohol-based solvent, a silicon-based solvent, or a mixture thereof prior to the step (a).

4. The method according to claim 1, wherein the substrate is made of an inorganic material, an organic material, or a composite thereof.

5. The method according to claim 1, wherein the depositing of step (a) is carried out by spin coating, roll coating, dip coating, spray coating, flow coating, or screen printing.

6. The method according to claim 1, wherein the exposing of step (c) is carried out in an atmosphere of a vacuum, air, $O_2$, $H_2$, $N_2$, Ar or a gas mixture thereof.

7. The method according to claim 1, wherein the exposing of step (c) is carried out at room temperature or at a temperature where the thermal decomposition of the metal complex does not occur.

8. The method according to claim 1, wherein the exposing of step (c) is carried out by the use of UV light as the light source.

9. The method according to claim 1, wherein the developing of step (d) is carried out by the use of a nitrile-based solvent, an aliphatic hydrocarbon-based solvent, an aromatic hydrocarbon-based solvent, a ketone-based solvent, an ether-based solvent, an acetate-based solvent, an alcohol-based solvent, a silicon-based solvent, or a mixture thereof.

10. The method according to claim 1, wherein the reducing or oxidizing of step (e) is carried out in a liquid-or gas-phase.

11. The method according to claim 1, wherein the reducing of step (e) is carried out by the use of a reductant selected from the group consisting of hydrazines, silanes, amines, and metal hydrides.

12. The method according to claim 1, wherein the oxidizing of step (e) is carried out by the use of an oxidant selected from the group consisting of N-oxides, peroxides, perbenzoic acid, $O_3$, $O_2$, hydrogen peroxide, sulfuric acid, and nitric acid.

13. The method according to claim 1, wherein the reducing of step (e) is carried out in an atmosphere of a vacuum, or $H_2$, $N_2$, Ar or a gas mixture thereof.

14. The method according to claim 1, wherein the oxidizing of step (e) is carried out in an atmosphere of air, or $O_2$.

15. The method according to claim 1, further comprising annealing at a temperature of 30–1,000° C. after step (e).

16. The method according to claim 1, wherein the metal complex is $Ag(NH_2Pr)n(NO_3)$, $Ag(NH_2Pr)n(NO_2)$ or $Au(NH_2Pr)CN$ where Pr is propyl and n is 1, 2, 3 or 4.

17. The method according to claim 1, wherein the metal complex is $Ag(NH_2Bu)n(NO_3)$, $Ag(NH_2Bu)n(NO_2)$, $Ag\{C_2H_5CH(NH_2)CH_3\}_2(NO_3)$, $Ag(aniline)_2(NO_3)$, $Ag(TMEDA)_2(NO_3)$, $Ag(t-BuNH_2)_2(NO_3)$, $Ag(Py_2)(NO_3)$, $Ag(NH_2C_3H_6OH)_2(NO_3)$ or $Ag(NH(C_2H_4OH)_2)_2(NO_3)$ where Bu is butyl, TMEDA is tetramethylethylenediamine, Py is Pyridine and n is 1, 2, 3 or 4.

18. A method of forming a metal or metal oxide pattern on a substrate comprising the steps of:
(a) depositing a thin film of a metal complex on a surface of the substrate;
(b) providing a photomask having a desired pattern on the thin film;
(c) exposing the film to a light source to cause the metal complex in the exposed areas of the film to be decomposed resulting in a difference of solubility between the exposed areas and the unexposed areas;
(d) developing the film with an organic solvent to remove the metal complex in the unexposed areas leaving only a metal-containing patterned film; and
(e) reducing or oxidizing the metal-containing patterned film to provide a pure metal or metal oxide pattern on the substrate, wherein
the metal complex is represented by the formula (I):

$$M_mL_nX_p \quad (I)$$

wherein;
M is a metal atom selected from transition elements, lanthanoids, and main group elements;
L is an organic ligand comprising at least one donor atom and 20 or less carbon atoms;
X is a mono-, di- or tri-valent anion;
m is an integer ranging from 1 to 60, provided that L's may be different from each other when n is 2 or more;
p is an integer ranging from 0 to 60, provided that X's may be different from each other when p is 2 or more;
n plus p is not equal to 0; and
M may be connected with another M by L when m is 2 or more.

* * * * *